United States Patent [19]

Kobayashi

[11] Patent Number: 5,100,756
[45] Date of Patent: Mar. 31, 1992

[54] IMAGE FORMING MEDIUM COATED WITH MICROCAPSULES HAVING PHOTOCURABLE COMPOSITION

[75] Inventor: Naomichi Kobayashi, Nagoya, Japan

[73] Assignee: Brother Kogyo Kabushiki Kaisha, Aichi, Japan

[21] Appl. No.: 569,621

[22] Filed: Aug. 20, 1990

[30] Foreign Application Priority Data

Aug. 21, 1989 [JP] Japan .................................. 1-214693

[51] Int. Cl.$^5$ .............................................. G03C 1/72
[52] U.S. Cl. ................................... 430/138; 430/281; 430/292; 430/913
[58] Field of Search ............... 430/138, 281, 292, 913, 430/914; 522/28, 29, 64, 66; 803/214, 218

[56] References Cited

U.S. PATENT DOCUMENTS

| | | | |
|---|---|---|---|
| 4,162,162 | 7/1979 | Dueber | 430/288 |
| 4,399,209 | 8/1983 | Sanders et al. | 430/138 |
| 4,440,846 | 4/1984 | Sanders et al. | 430/138 |
| 4,707,432 | 11/1987 | Gatechair et al. | 522/29 |
| 4,808,638 | 2/1989 | Steinkraus et al. | 522/24 |
| 4,837,106 | 6/1989 | Ishikawa et al. | 430/138 |
| 4,840,866 | 6/1989 | Kovacs et al. | 430/138 |
| 4,874,684 | 10/1989 | Yamamoto | 430/138 |
| 4,904,561 | 2/1990 | Yamamoto | 430/138 |
| 4,957,946 | 9/1990 | Meier et al. | 430/280 |
| 4,987,056 | 1/1991 | Imahashi et al. | 430/281 |

FOREIGN PATENT DOCUMENTS

| | | | |
|---|---|---|---|
| 126712 | 11/1984 | European Pat. Off. | 522/29 |
| 152377 | 8/1985 | European Pat. Off. | 522/28 |
| WO81/01289 | 5/1981 | PCT Int'l Appl. | 522/29 |

OTHER PUBLICATIONS

"Eosine", Chemical Dictionary, Grant & Hackh's, Fifth Edition, p. 215.

Primary Examiner—Hoa Van Le
Attorney, Agent, or Firm—Oliff & Berridge

[57] ABSTRACT

An image forming medium includes a base coated with a layer of at least three kinds of microcapsules encapsulating photocurable compositions for forming a color image thereon. The photocurable compositions contain a radical-polymerizable unsaturated compound, a photosensitizer and a photopolymerization initiator. The photosensitizer may be selected from several dyes which have sensitivity to different spectra of light.

7 Claims, 1 Drawing Sheet

IMAGE FORMING MEDIUM COATED WITH MICROCAPSULES HAVING PHOTOCURABLE COMPOSITION

BACKGROUND OF THE INVENTION

This invention relates to an image forming medium for forming a color image thereon, and more particularly to an image forming medium having high sensitivity for copying a color image using no specifically-manufactured sheet coated with developer material.

There has been conventionally utilized an image forming apparatus for irradiating an image light to a photosensitive recording medium coated thereon with microcapsules encapsulating photocurable composition such as photocurable material, dye, polymerization initiator and so on, whereby the microcapsules are cured only at exposed areas to record the image on the recording medium. The microcapsules used in the conventional image forming apparatus have low sensitivity, so that it takes a long time to perform an exposure process for irradiating light to the microcapsules. Further, the dye encapsulated in the microcapsules comprises leuco dye, and thus is required to be contacted with developer agent for color-developing the leuco dye through a reaction between the leuco dye and the developer agent. As a result, in order to perform a copying operation, a specific sheet such as a developer sheet coated with the developer agent must be used.

SUMMARY OF THE INVENTION

In view of the foregoing, an object of this invention is to provide an image forming medium on which a color image is formed on a plain paper for a short exposure time with high sensitivity.

In order to attain the above object, an image forming medium of this invention is coated with microcapsules encapsulating a photocurable composition including mainly radical-polymerizable unsaturated compound as a photopolymerizable material, dye as photosensitizer and an iron arene compound as a photopolymerization initiator to improve sensitivity. The dye can be used not only as the photosensitizer, but also as an image recording material to be supplied to a sheet.

DETAILED DESCRIPTION OF THE INVENTION

Figure 1:
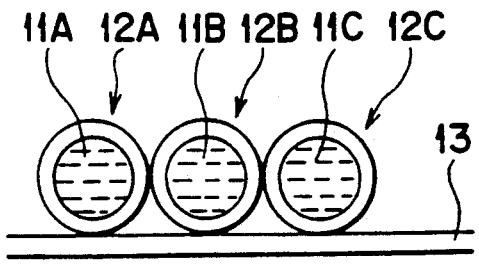
FIG. 1 shows an image forming medium according to this invention on which the three kinds of microcapsules are coated.

A preferred embodiment of this invention will be described hereunder with reference to the accompanying drawings.

Examples of radical-polymerizable unsaturated compounds include N-vinyl-2-pyrrolidone, bisphenol A diacrylate or dimethacrylate (hereafter, acrylate and methacrylate being collectively referred to as "(meth)acrylate"), tripropylene glycol di(meth)acrylate, polyethylene glycol di(meth)acrylate, pentaerythritol tri(meth)acrylate, dipentaerythritol hexa(meth)acrylate, trimethylolpropane tri(meth)acrylate and oligo ester (meth)acrylate. These compounds may be used alone or as a mixture thereof The iron arene compound has a structure represented by formula (I):

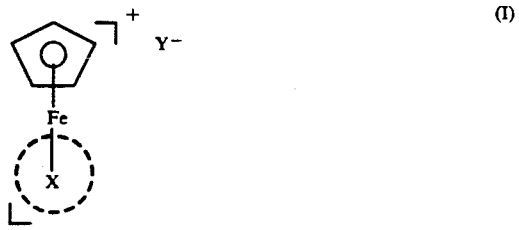

wherein X is a group containing at least one benzene ring and $Y^-$ is a basic ion such as $BF_4^-$, $PF_6^-$, $AsF_6^-$ and $SbF_6^-$.

The dye serving as a photosensitizer includes any material of coumarin dyes, xanthene dyes, thiazine dyes, azine dyes and so on.

A photocurable composition mainly encapsulating the radical-polymerizable unsaturated compound (polymerizable material), the dye and the iron arene compound as described above is subjected to a well-known technique such as coacervation, interfacial polymerization and other melting methods to form microcapsules. The microcapsules thus formed are mixed with polyvinyl alcohol serving as a binder and then coated on a thin film type sheet to thereby form a microcapsule layer on the sheet, and thus an image forming medium of this invention.

When the image forming medium coated with the photocurable composition encapsulated in the microcapsules is exposed to light, the photosensitizer such as an azine dye encapsulated in the microcapsules is excited as shown in scheme (1):

Then, the excited photosensitizer makes the photopolymerization initiator, i.e., the iron arene compound, radical through electron-transfer as shown in scheme (2):

The radical substance triggers addition polymerization of the compound having a radical-polymerizable unsaturated compound as shown in scheme (3):

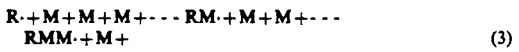

In the above schemes, D, R, R· and M represent a sensitizer, a metal arene compound, its radical substance and a radical-polymerizable unsaturated compound (monomer), respectively.

Those microcapsules which are not irradiated to light, that is, are not cured, are ruptured in a pressure-development by pressure-developing rollers, and uncured photocurable composition issued from the ruptured microcapsules is attached to any sheet such as a plain paper or the like. The photocurable composition is originally colored by the dye encapsulated in the microcapsules, and therefore this attachment of the photocurable composition to any sheet such as the plain paper or the like results in formation of a visible color image on the sheet.

An image forming process using the image forming medium according to this invention will be described hereunder with reference to the accompanying drawings, representatively when the following three kinds of photocurable compositions (11A, 11B and 11C) are used.

The photopolymerizable material and the iron arene compound are commonly used in the photocurable compositions. However, three kinds of dyes are separately used for the photocurable compositions for red, green and blue colors, respectively.

For example, 10 g of monomers (polyethylene glycol diacrylate and dipentaerythritol hexaacrylate (composition ratio 3:4) are used as the photopolymerizable material, and 0.1 g of iron arene compound and 0.1 g of dyes serving as photosensitizers are used. As the dyes serving the photosensitizers and coloring materials are used 3-thenoyl-7-dimethylaminocoumarin (referred to as "coumarin dye A") having sensitivity to red eosine y dye (referred to as eosine yellowish or "xanthene dye B") having sensitivity to green light and methylene blue (referred to as "thiazine dye C") having sensitivity to red light, respectively.

FIG. 1 shows an image forming medium according to this invention on which the three kinds of microcapsules are coated. The microcapsules 12A, 12B and 12C encapsulate the photocurable compositions 11A, 11B and 11C which commonly includes the photopolymerizable material and the iron arene compound as described above, and further separately includes the coumarin dye A, the xanthene dye B and the thiazine dye C, respectively. The microcapsules 12A, 12B and 12C are coated on a film base 13 to form an image forming medium.

Figure 2:
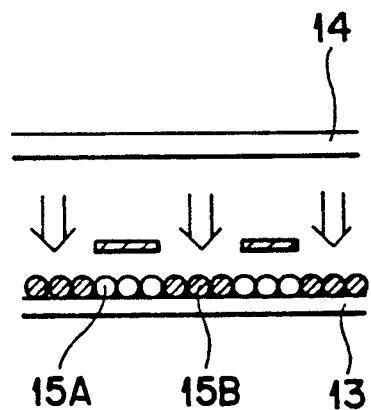
FIG. 2 is a schematic view of showing an exposure process in which the microcapsules coated on a base sheet are exposed to light.
Figure 3:
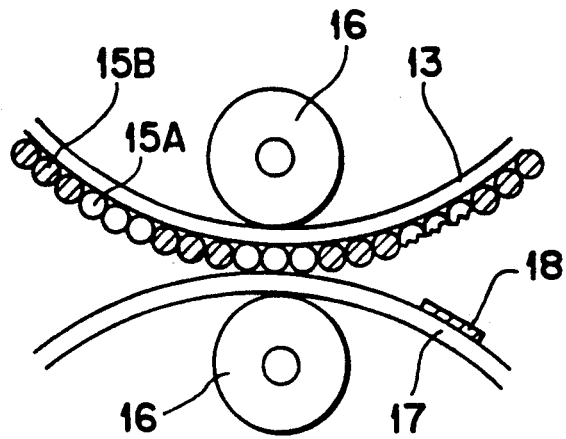
FIG. 3 is a schematic view of showing an image transferring process in which a visible image formed on the image forming medium is transferred to an image supporting medium such as plain paper.

FIG. 2 is a schematic view of showing an exposure process in which the microcapsules coated on the base 13 are exposed to light, and FIG. 3 is a schematic view of showing an image transferring process in which a color visible image is transferred to an image supporting sheet such as plain paper or the like.

As shown in FIG. 2, the image forming medium is exposed to a white light through a mask, thereby photocuring those microcapsules 15B which are exposed to the light. Thereafter, as shown in FIG. 3, the image forming medium is superposed over the image supporting medium such as plain paper and fed to a gap between pressure-developing rollers 16. In this case, those microcapsules 15A which are not exposed to the light (that is, uncured) are ruptured, and the photocurable compositions issued from the ruptured microcapsules are attached to the image supporting medium, thereby forming a visible image 18 on the image supporting medium.

This invention is not limited to the above embodiment. Any modifications may be made insofar as they do not depart from the subject matter of this invention.

According to this invention, the photocurable compositions encapsulated in the microcapsules are provided with iron arene compounds serving as photopolymerization initiator and dyes serving as photosensitizer to improve sensitivity of the image forming medium, so that an exposure time is more reduced. Further, if yellow, magenta and cyan dyes are used as the photosensitizer, a visible image can be formed on an image supporting medium such as plain paper, and thus no specifically-manufactured sheet such as a developer sheet is not required to form a visible image.

What is claimed is:

1. An image forming medium comprising a base coated with a layer of at least three kinds of microcapsules encapsulating photocurable compositions for forming a color image thereon, wherein said photocurable compositions comprise a radical-polymerizable unsaturated compound, a photosensitizer and a photopolymerization initiator, said photosensitizer comprising a dye, and wherein a first said kind of microcapsules include coumarin dyes having a sensitivity to blue light, a second said kind of microcapsules include xanthene dyes having a sensitivity to green light and a third said kind of microcapsules include thiazine dyes having a sensitivity to red light.

2. An image forming medium as claimed in claim 1, wherein said photopolymerization initiator comprises an iron arene compound.

3. An image forming medium as claimed in claim 1, wherein said radical-polymerizable unsaturated compound comprises any material selected from the group consisting of N-vinyl-2-pyrrolidone, bisphenol A diacrylate or dimethacrylate, tripropylene glycol diacrylate or dimethacrylate, polyethylene glycol diacrylate or dimethacrylate, pentaerythritol triacrylate or trimethacrylate, dipentaerythritol hexaacrylate or hexamethacrylate, trimethylolpropane triacrylate or trimethacrylate and oligo ester acrylate or methacrylate.

4. An image forming medium as claimed in claim 2, wherein said photopolymerization initiator comprises an iron arene compound having a structure represented by formula

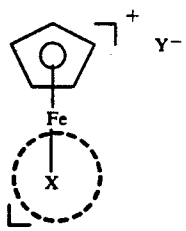

(I)

wherein X is a group containing at least one benzene ring and Y$^-$ is any basic ion selected from the group consisting of BF$_4^-$, PF$_6^-$, AsF$_6^-$ and SbF$_6^-$.

5. An image forming medium as claimed in claim 1, wherein said coumarin dyes comprise 3-thenolyl-7-dimethylaminocoumarin.

6. An image forming medium as claimed in claim 1, wherein said xanthene dyes comprise eosine.

7. An image forming medium as claimed in claim 1, wherein said thiazine dyes comprise methylene blue.

* * * * *